United States Patent [19]

Maschek et al.

[11] Patent Number: 4,754,224
[45] Date of Patent: Jun. 28, 1988

[54] CIRCUIT ARRANGEMENT FOR CONVERTING AN INPUT VOLTAGE INTO A PROPORTIONAL OUTPUT SIGNAL

[75] Inventors: Martin Maschek, Würenlos; Georg Mastner, Niederrohrdorf, both of Switzerland

[73] Assignee: BBC Brown, Boveri & Company Limited, Baden, Switzerland

[21] Appl. No.: 8,160

[22] Filed: Jan. 29, 1987

Related U.S. Application Data

[63] Continuation of Ser. No. 650,502, Sep. 14, 1984, abandoned.

[30] Foreign Application Priority Data

Sep. 22, 1983 [CH] Switzerland ............................. 5152/83

[51] Int. Cl.[4] ........................ H03B 28/00; H03K 5/00
[52] U.S. Cl. ........................................ 328/21; 328/165; 330/86; 330/254; 330/282; 330/302; 330/303; 307/543; 307/546; 307/550; 307/562
[58] Field of Search ............... 307/543, 546, 548, 556, 307/557, 562, 568, 271, 540, 553; 328/21, 138, 139, 165, 167; 330/259, 256, 282, 289, 290, 302, 303, 306, 76, 86, 254, 261, 279

[56] References Cited

U.S. PATENT DOCUMENTS

| | | | |
|---|---|---|---|
| 3,863,173 | 1/1975 | Scheib et al. | 330/98 |
| 4,383,229 | 5/1983 | Jones | 333/176 |
| 4,547,742 | 10/1985 | Maschek et al. | 330/149 |
| 4,584,558 | 4/1986 | Maschek et al. | 340/347 AD |

FOREIGN PATENT DOCUMENTS 2650583 of 0000 Fed. Rep. of Germany.
2092641 of 0000 France.
1277953 of 0000 United Kingdom.

OTHER PUBLICATIONS

Electronic Design, Band 26, Nr. 15, Jul. 19, 1978, Seiten 68–73, Rochelle Park, (US).

Primary Examiner—Stanley D. Miller
Assistant Examiner—Richard Roseen
Attorney, Agent, or Firm—Oblon, Fisher, Spivak, McClelland & Maier

[57] ABSTRACT

A circuit arrangement for converting an input voltage into a proportional ouput signal, including a converting resistance which is followed by operational amplifier having a feedback resistance. For the purpose of stabilizing the gain of the circuit arrangement with respect to changes in the converting resistance, the latter is formed by connecting two branch resistances in parallel with each other. These branch resistances are series-connected in a bridge circuit to which a direct voltage is supplied from a voltage source. The bridge circuit also includes an operational amplifier and high-quality film resistors and a variable balancing resistance which includes, in series, another film resistor and a field effect transistor. An integrator automatically balances the bridge circuit by controlling the field effect transistor. The balancing resistor. The feedback resistance operational of the amplifier contains, in series, a film resistor which corresponds to the film resistor in the balancing resistance and a field effect transistor which is matched to the field effect transistor (13) in the balancing resistance. The field effect transistors are controlled in parallel by the integrator. The circuit arrangement can be used for processing the output signal of a capacitive voltage transducer.

13 Claims, 2 Drawing Sheets

CIRCUIT ARRANGEMENT FOR CONVERTING AN INPUT VOLTAGE INTO A PROPORTIONAL OUTPUT SIGNAL

This application is a continuation of application Ser. No. 650,502, filed Sept. 14, 1984 now abandoned.

BACKGROUND OF THE INVENTION

1. Field of the Invention

This invention relates to a circuit arrangement for converting an input voltage into a proportional output signal with the aid of a converting impedance, and to the use of this arrangement.

2. Discussion of the Background

Generic circuit arrangements are known which have fixed converting impedances are used for converting the input voltage into a current which has a proportional or otherwise clearly functional relationship to this voltage. The current, if necessary, is converted by suitable means, for example an amplifier having a fixed gain, into an output signal which is proportional to the input voltage (see for example U. Tietze, Ch. Schenk: Halbleiterschaltungstechnik (semiconductor circuit engineering), 5th edition, pages 106–108).

However, these circuits, which are well known to the specialist, are unsuitable, or suitable only when very expensive components are used, if requirements are set simultaneously which include high precision and long-term stability in the conversion of the input voltage and, in addition, necessitate the converting impedance to have extreme values.

Such requirements occur, for example, in processing the output signal of a voltage transducer constructed as a capacitive voltage divider where, because of the restriction in time constant required by the standard, it is necessary to use a converting resistance of very high value as a converting impedance. In addition, this impedance must have high electric strength because of the occurrence of transient over-voltages.

It is not possible to implement conventional circuits meeting such requirements, at least not by cost-effective means.

SUMMARY OF THE INVENTION

Accordingly, it is the object of this invention to provide a remedy for the above-noted problem by providing a circuit arrangement for converting an input voltage into a proportional output signal, which arrangement operates with extreme accuracy and long-term stability and can be produced very cost-effectively.

The object above-noted is achieved by providing a novel circuit arrangement for converting an input voltage lying within a predetermined range of working frequencies into a proportional output signal, and having a converting impedance formed by connecting a first branch impedance in parallel with a second branch impedance which is at least approximately equal in impedance. The circuit arrangement includes a bridge circuit in which the first branch impedance and the second branch impedance are in series in one branch, a voltage source which supplies a control voltage to the bridge circuit in a range of control frequencies which does not overlap the range of working frequencies, and at least one first isolating impedance which passes currents in the range of working frequencies and blocks currents in the range of control frequencies and which follows the first branch impedance.

The advantages achieved by the invention may be seen especially in that the demands having to be made of the converting impedance with respect to accuracy and stability are considerably reduced. This makes it possible to optimize the converting impedance, without constraints, in respect of other technical requirements such as, for example, electric strength and it can also be implemented much more cost-effectively.

In particular, appropriately adapted circuit arrangements according to the invention meet all the requirements set for the processing of the output signal of a capacitive voltage transducer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
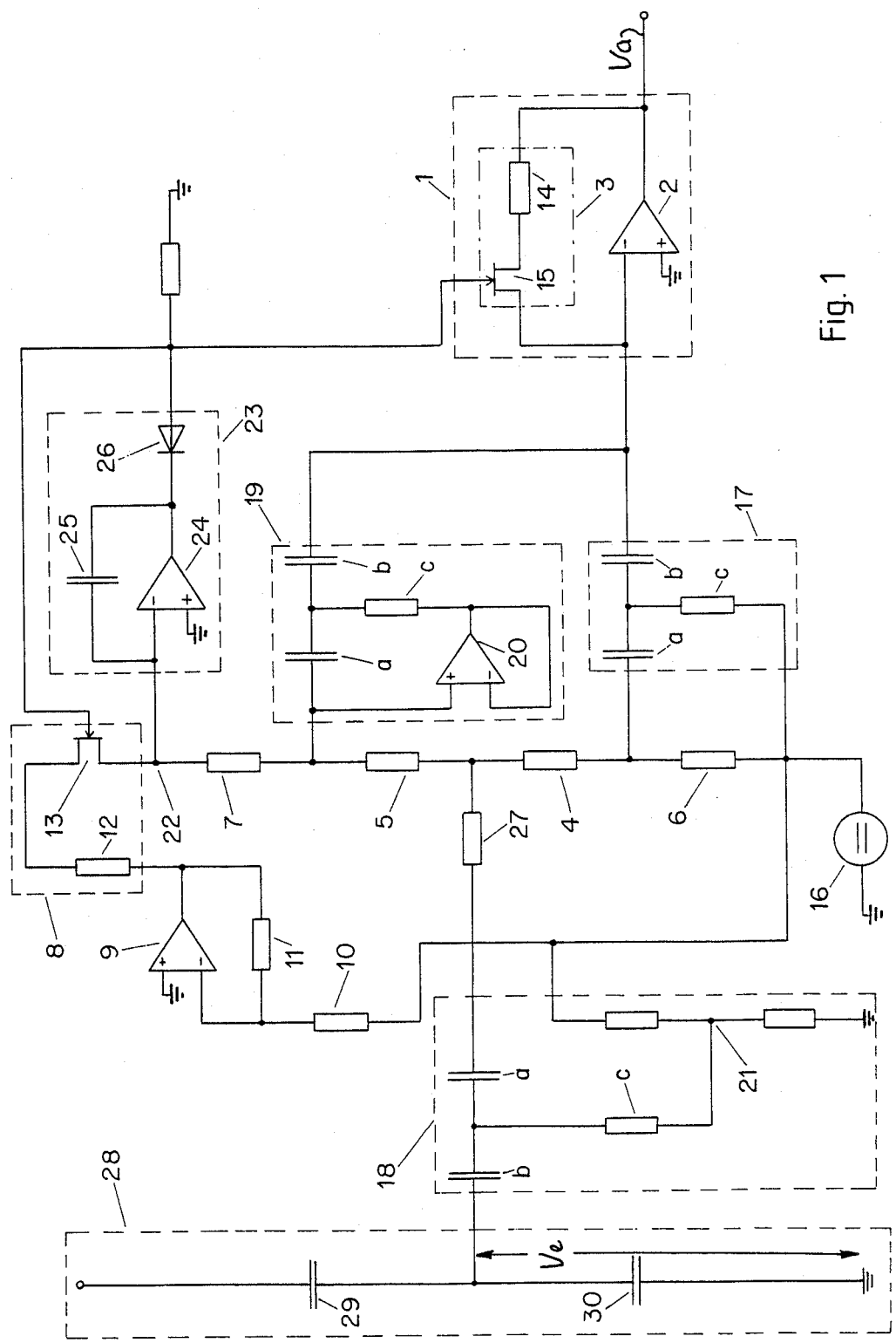
FIG. 1 is a circuit diagram of a first embodiment of the invention in detail.

Referring now to the drawings, wherein like reference numerals designate identical or corresponding parts throughout the several views, FIG. 1 shows a first design of a circuit arrangement for converting an alternating input voltage $U_e$, which is above a lower cut-off frequency $\omega_o > 0$, into a proportional output signal, the basic configuration of which arrangement contains a converting resistance having a value R which is followed by an amplifier 1 which includes an operational amplifier 2 and a feedback resistance 3 having the value $R_3$.

According to the invention, the converting resistance is essentially formed by connecting a first branch resistance 4 having a value $R_4$ in parallel with respect to A.C. network analysis, with a second branch resistance 5 having a value $R_5 \approx R_4$ which are of very high resistance.

The first branch resistance 4 and the second branch resistance 5 are connected in series in a bridge circuit which, in addition, comprises a first resistance 6 and a second resistance 7 which in each case have a value $R_6 << R_4$, a variable balancing resistance 8 and an operational amplifier 9 having a series resistance 10 and a feedback resistance 11. The balancing resistance 8 is formed by connecting a fixed resistance 12 in series with a field effect transistor 13. The values $R_{10}$–$R_{12}$ of the resistances 10–12 must be maintained very accurately and are allowed to vary only within the narrowest tolerances even in long-term operation. It is recommended to use high-quality film resistors such as are offered, for example, by the company, VISHAY. The same applies to a fixed resistance 14 which, in series with a field effect transistor 15, forms the feedback resistance 3 of the amplifier 1. The resistance 14 has the same value $R_{12}$ as that of resistance 12. The field effect transistors 13 and 15 should have identical characteristics, if possible. Such matched pairs of field effect transistors are commercially available (e.g. U 421 from the company, Silicon ix).

The branch resistances 4 and 5, which may have values within the range of some 10 MΩ to some 100

MΩ, do not need to meet any very high requirements with respect to precision and stability which is why comparatively inexpensive resistances such as metal film resistors may be used at these points. The values of the resistances 10–12 and 14, in turn, may be of the order of magnitude of 1 MΩ and below.

A voltage source 16 supplies a direct voltage to one side of the bridge circuit. The operational amplifier 9 in combination with resistors 10 and 11 translates the D.C. voltage from source 16 to a corresponding D.C. voltage applied to the other side of the bridge circuit.

Between the first branch resistance 4 and the amplifier 1, a first isolating capacitance 17 is located which does not pass direct current but has a sufficiently low impedance for alternating current above the lower cut-off frequency $\omega_o$. Similarly, a second isolating capacitance 18 is placed into the input and a third isolating capacitance 19 between the second branch impedance 5 and the amplifier 1. The isolating capacitances 17–19 are in each case implemented as series circuits of a first capacitance a and a second capacitance b, the first capacitance a being bridged in each case in such a manner that at least the direct-voltage component on both sides of it is approximately of equal magnitude (boot-strapping). This almost completely prevents leakage currents across the inside part capacitance a. The bridging may be carried out, for example, by an operational amplifier 20 connected as a voltage follower or, if the magnitude of the direct-voltage component at the inner connection of the first capacitance a is known, by a voltage divider 21 fed from the voltage source 16. In the case of the first isolating capacitance 17, direct connection to the voltage source 16 is possible because of the relatively small magnitude of the value $R_6$ of the first resistance 6. In each case, a high-value resistance c results in the alternating current flowing across it as being negligibly small.

At a balancing point 22 of the bridge circuit, the input of a balancing loop, constructed as integrator 23, is located. Integrator 33 includes an operational amplifier 24 provided with a feedback via a capacitor 25 and a following diode 26. The capacitor 25 is dimensioned in such a manner that frequencies above the lower cut-off frequency $\omega_o$ are largely suppressed by the integrator 23. The output signal of the integrator 23 controls the field effect transistor 13 in balancing resistance 8 and controls with the field effect transistor 15 in the feedback resistance 3 of the amplifier 1. As described, FIG. 1 shows a circuit which is functionally equivalent to a bridge circuit. The D.C. source 16, amplifier 9 and associated resistors 10 and 11 are functionally equivalent to two interconnected voltage sources having their common terminal grounded. Therefore, it is possible to dispense with branch resistances which would otherwise be needed in parallel with transistor 13 and branch resistances 4 and 5, respectively. The "functionally equivalent" bridge circuit is completed by means of the comparison of the voltage at junction 22 with respect to ground by means of the integrator 23.

The input of the circuit arrangement includes a compensating resistance 27 which follows the capacitance 18 and which approximately has the same value as large as the resistance value of a parallel connection of resistances $R_6$ and $R_7$ would be, that is to say approximately ($R_6/2$) and is implemented in the same manner as these resistances.

The circuit arrangement is used for processing the output signal of a voltage transducer 28 which is constructed as capacitive voltage divider containing a high-end capacitance 29 and a low-end capacitance 30.

In such an application, the low values $C_{29}$, $C_{30}$ of the high-end capacitance 29 and the low-end capacitance 30 which can be achieved in an economically acceptable manner, being within the range of some pF or some nF, and the restriction of the time constant to—depending on the converter class—some 100 msec to some seconds, require the converting resistance to have high values R since $\tau = R(C_{29} + C_{30})$ applies and compensation of greater phase errors should be avoided from the point of view of stability. This results in correspondingly high values for the branch resistances 4 and 5 within the range mentioned above.

The circuit arrangement operates as follows:

The alternating input voltage $U_e$ supplied by the voltage converter 28 is present, transmitted by the isolating capacitance 18, across the converting resistance formed by the compensating resistance 27 and the parallel-connected branch impedances 4, 5 and having the value $$R = \frac{R_6}{2} + \frac{R_4 R_5}{R_4 + R_5}$$

and generates an alternating current which reaches the input of the amplifier 1 via the isolating capacitances 17 and 19 which, together with the flanking resistances 6 and 7 act as high-pass filter having a cut-off frequency below $\omega_o$. The alternating current is compensated in the operational amplifier 2 via the feedback resistance 3, resulting in an output voltage $U_a$ having the value $$U_a = -\frac{R_3}{R} U_e.$$

Since $R_3$ is much smaller than R, the absolute value of the gain $$k = \frac{U_a}{U_e} = -\frac{R_3}{R} \quad (1)$$

is here much smaller than one.

The bridge circuit, in which the branch impedances 4 and 5 are connected in series in one branch, is kept continuously balanced by the integrator 23. As soon as the balance of the bridge circuit shifts, for example due to a change of one of the branch resistances, a current flows into the integrator 23, the output voltage of which acts on the gate of the field effect transistor 15 and thus affects the drain-source resistance of the latter in such a manner that the bridge circuit resumes its balanced state by adapting the value $R_8$ of the balancing resistance 8. In this arrangement, the condition for complete balance is $$R_4 + R_5 + 2R_6 = \frac{R_{11}}{R_{10}} \cdot R_8, \text{ i.e.} \quad (2)$$

$$R_8 = 2\frac{R_{10}}{R_{11}} \left( \frac{R_4 + R_5}{2} + R_6 \right).$$

If now the value of the first branch resistance 4 changes from $R_4$ to $R_4(1+d_4)$, for example by aging or change in environmental parameters, that of the second branch resistance 5 changes from $R_4$ to $R_4(1+d_5)$ and the value of the compensating resistance 27 changes from $$\frac{R_6}{2} \text{ to } \frac{R_6}{2} (1 + d_{27}),$$

the converting resistance changes its value from $$R = \frac{R_4}{2} + \frac{R_6}{2} \text{ to} \tag{3}$$

$$R' = \frac{R_4 (1 + d_4)(1 + d_5)}{2\left(1 + \frac{d_4}{2} + \frac{d_5}{2}\right)} + \frac{R_6}{2}(1 + d_{27})$$

which, neglecting terms of quadratic and higher order in the relative changes of resistances, leads to $$\begin{aligned} R' &= \frac{R_4}{2}\left(1 + \frac{d_4}{2} + \frac{d_5}{2}\right) + \frac{R_6}{2}(1 + d_{27}) \\ &= R\left(1 + \frac{d_4}{2} + \frac{d_5}{2}\right)\left(1 + \frac{R_6}{R_4 + R_6} \frac{1 + d_{27}}{1 + \frac{d_4}{2} + \frac{d_5}{2}}\right) \end{aligned} \tag{4}$$

Assuming that the values of the resistances 6 and 7 are subject in each case to a relative change $d_6$, the balancing condition (2) shows that $R_8$ changes from $$2\frac{R_{10}}{R_{11}}(R_4 + R_6) \text{ to} \tag{5}$$

$$\begin{aligned} R_8' &= 2\frac{R_{10}}{R_{11}}\left[R_4\left(1 + \frac{d_4}{2} + \frac{d_5}{2}\right) + R_6(1 + d_6)\right] \\ &= R_8\left(1 + \frac{d_4}{2} + \frac{d_5}{2}\right)\left(1 + \frac{R_6}{R_4 + R_6} \frac{1 + d_6}{1 + \frac{d_4}{2} + \frac{d_5}{2}}\right) \end{aligned}$$

On the basis of the assumption that the value of the compensating resistance 27 which, of course, is constructed similarly to the resistances 6 and 7, is subject to the same relative change as the latter, that is to say $d_{27}=d_6$, equations (4), (5) show that $R_8$ changes in proportion to R.

Since now the feedback resistance 3 is constructed in the same manner as the balancing resistance 8 and is also controlled by the integrator 23 in exactly the same manner, the value $R_3$ of the feedback resistance 3 also changes in proportion to the value of the converting resistance R and the gain k thus remains the same in accordance with equation (1).

The compensating resistance 27, which is exclusively used for compensating false changes, as it were, which are due to changes in the values of the resistances 6 and 7 which do not affect the gain k, of the balancing resistance 8 and thus of the feedback resistance 3, may be omitted under certain circumstances since the influence of any changes in the values of the flanking resistances 6 and 7 on the balancing resistance 8 is small because $R_6>>R_4$ as can be seen from equation (5).

The isolating capacitances 17–19 were chosen to have the relatively elaborate designs described above in order to reduce interfering effects of leakage currents on the bridge circuit to a harmless level.

The values $C_{17}$–$C_{19}$ of the isolating capacitances 17–19 should be much greater than the values $C_{29}$ and $C_{30}$ of the capacitances of the voltage converter 28 in order to avoid a disturbing reduction in the time constant $\tau$.

Figure 2:
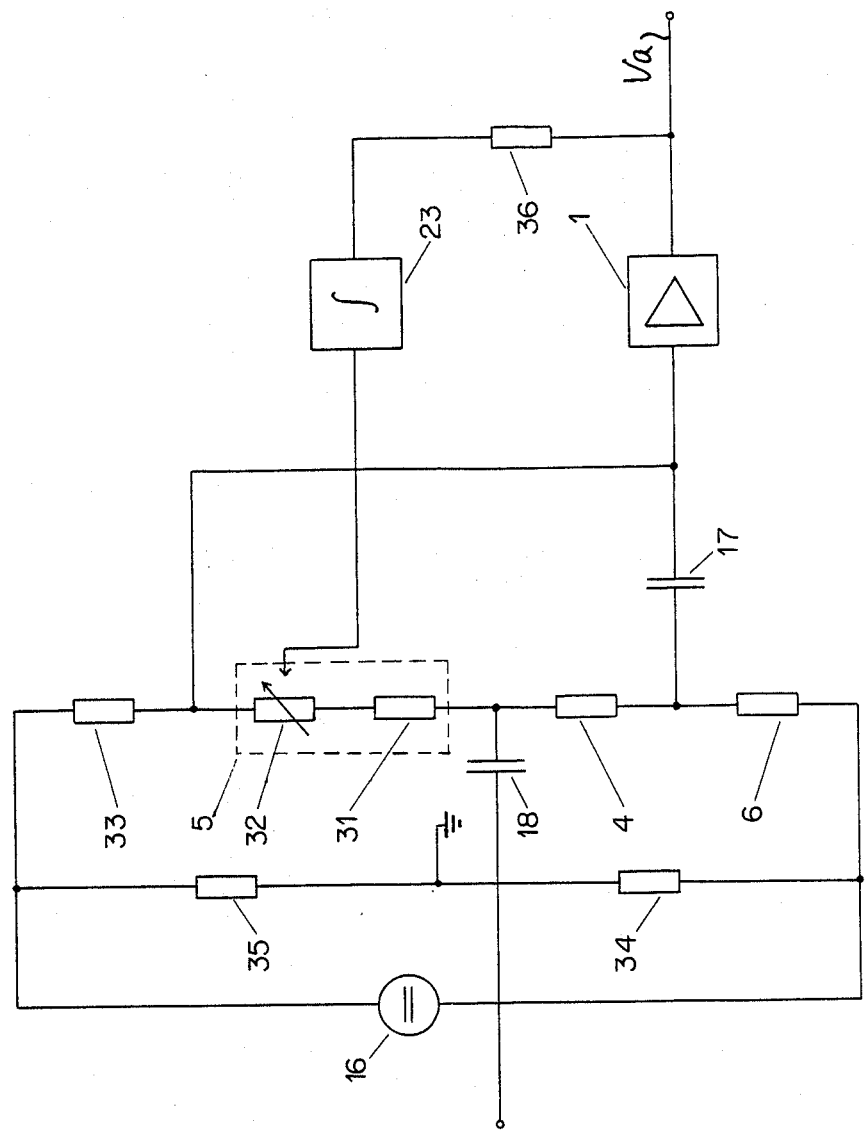
FIG. 2 is a circuit diagrams of a second embodiment of the invention in partially simplified representation.

FIG. 2 shows a second embodiment of a circuit arrangement for converting an alternating input voltage $U_e$, which is above a lower cut-off frequency $\omega_o<0$, into a proportional output signal, which arrangement, in its fundamental configuration, also contains a converting resistance having a value R which is followed by an amplifier 1.

According to the invention, the converting resistance is again formed by connecting a first branch resistance 4 having a value $R_4$ in parallel with a second branch resistance 5 having a value $R_5 \approx R_4$. The second branch resistance 5 is implemented as a fixed resistance 31 being connected in series with a variable resistance 32 and simultaneously forms the balancing resistance in a bridge circuit in which the branch resistances 4, 5, together with a resistance 6 having a value $R_6<<R_4$, are located in one branch and which in its other branches contains resistances 33–35 which are preferably constructed as high-quality film resistors. A voltage source 16 supplies the bridge circuit with a direct voltage.

The connection opposite to the input connection of the second branch impedance 5 which is located at a balancing point 22 of the bridge circuit, is connected directly to the input of the amplifier 1. Between the first branch resistance 4 and the input of the amplifier 1, a first isolating capacitance 17 is located which has a high insulating effect.

The input of the circuit arrangement is followed by a second isolating capacitance 18 which also has a high insulating effect. The output of the amplifier 1 is connected via a high-value resistance 36 with the input of an integrator 23 which suppresses frequencies above the lower cut-off frequency $\omega_o$. It controls the variable resistance 32.

The amplifier 1 may be constructed in a similar manner as in the first embodiment but having a constant feedback resistance. The ratio between its input current $I_e$ and the output voltage $U_a$, its gain $$k' = (U_a/I_e) \tag{6}$$

may fluctuate only within the narrowest limits which can be achieved by using a high-quality film resistor as the feedback resistance.

The isolating capacitances 17, 18 and the integrator 23 can be implemented similarly to the first embodiment and the variable resistance 32 again as a field effect transistor.

The circuit arrangement operates as follows:

At the converting impedance having the value $$R = (R_4 R_5)/(R_4 + R_5)$$

formed by connecting the branch impedances 4 and 5 in parallel with each other, the alternating input voltage $U_e$ produces an alternating current $$I_e = (U_e/R) \qquad (7)$$

which flows to the amplifier 1 as input current. Because of equations (6) and (7), the gain $k = (U_a/U_e)$ of the total circuit arrangement is $$k'/R \qquad (8).$$

The bridge circuit is continuously kept in a balanced state by the integrator 23 since any deviation from this state produces a direct current at the input of the amplifier 1 which correspondingly generates at its output a direct voltage which is integrated by the integrator 23. The output signal of the integrator 23 then effects a compensating change in the value $R_{32}$ of the variable resistance 32 and thus of the second branch resistance 5.

Neglecting the resistance 6, the balancing condition for the bridge circuit is:

$$\frac{R_4 + R_5}{R_{33}} = \frac{R_{34}}{R_{35}}, \text{ i.e.} \qquad (9)$$

$$R_5 = \frac{R_{33} \cdot R_{34}}{R_{35}} - R_4. \qquad$$

If the value $R_{31}$ of the fixed resistance 31 changes, this change is completely compensated by an opposite change of $R_{32}$. The value $R_5$ of the first branch resistance 5 and the value R of the converting resistance do not change.

If the value $R_4$ of the first branch resistance 4 changes to $$R_4' = R_4(1 + d_4), \qquad (10)$$

$R_5$ changes into $$R_5' = R_5 - R_4 d_4 \approx R_5(1 - d_4) \qquad (11)$$

because of equation (9).

Taking into consideration $R_5 \approx R_4$ and neglecting a quadratic-order term in $d_4$, the value R' of the converting resistance is then found to be $$R' = \frac{R_4' R_5'}{R_4' + R_5'} = \frac{R_4 R_5 (1 + d_4)(1 - d_4)}{R_4 + R_5 + (R_4 - R_5) d_4} \qquad (12)$$

$$= \frac{R_4 R_5}{R_4 + R_5} = R.$$

From equations (8), (12) and the preceding comment, it now follows that the gain k of the circuit arrangement will not change if the fixed resistance 31 or the first branch resistance 4 changes.

In both embodiments, the high-quality film resistors are not exposed to the input voltage. Thus they can be neither damaged even in the event of transient overvoltages occurring nor temporarily changed in their characteristics by more intensive heating.

For further improvement in reliability, in each case a window comparator may be provided which monitors the output signal of the integrator 23 and sets an error signal if the latter exceeds a predetermined range because of a defect in the circuit arrangement.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A converting circuit for converting an input voltage having a predetermined range of working frequencies, which predetermined range is exclusive of a range of control frequencies, into a proportional output voltage, comprising:

a variable gain amplifier;

a first branch impedance and a second branch impedance which are connected in parallel in relation to said range of working frequencies between said input voltage and said amplifier, said first and second branch impedances being approximately equal in value;

first and second isolation circuit means respectively connected between said first branch impedance and said amplifier and between said second branch impedance and said amplifier such that said first and second branch impedances are connected in series in relation to said range of control frequencies and in parallel in relation to said range of working frequencies, said first branch impedance connected in series circuit with said first isolation circuit means, said second branch impedance means connected in series circuit with said second isolation circuit means, and the series circuit of said first branch impedance and said first isolation circuit means connected in parallel with the series circuit of said second branch impedance and the second isolation circuit means between a junction between the first and second branch impedances and the amplifier; and a control circuit in which said first and second branch impedances are connected in series in relation to said range of control frequencies, said control circuit comprising, a variable impedance balancing impedance connected in series with said first and second branch impedances in relation to said range of control frequencies, and a control voltage source for supplying a D.C. control voltage across the series combination of said balancing impedance and said first and second branch impedances, said D.C. control voltage and said variable impedance balancing impedance connected in series across the junction of the first branch impedance and the first isolation circuit means and the junction of the second branch impedance and the second isolation circuit means, and a balancing circuit having an input connected to a junction between the variable impedance balancing impedance and the first branch impedance for generating a balancing signal applied to said variable impedance balancing impedance and said variable gain amplifier, wherein said balancing signal adjusts the impedance of said balancing impedance and the gain of said amplifier such that if the impedances of said first and second branch impedances change in relation to a component of the input voltage lying in the range of control frequencies, a predetermined proportionality between the input signal and the output signal is maintained in the range of said working frequencies.

2. A converting circuit according to claim 1, comprising:
   a third isolating circuit means connected in series between said input voltage and the junction between said first and second branch impedances for passing currents in the range of working frequencies and blocking currents in the range of control frequencies.

3. A converting circuit according to claim 2, wherein the range of working frequencies is above a predetermined positive lower cut-off frequency, comprising:
   the first and second branch impedance respectively comprising a first branch resistance and a second branch resistance; and
   the balancing impedance comprising a balancing resistance.

4. A converting circuit according to claim 3, wherein said variable gain amplifier comprises:
   a variable feedback resistance for providing feedback from the output of the amplifier to the input of said amplifier.

5. A converting circuit according to claim 4, wherein the balancing resistance and the feedback resistance are identically constructed and have equal magnitudes and are connected by means of the same connection point to the balancing circuit.

6. A converting circuit according to claim 5, wherein the first and second isolating circuit means each comprise an isolating capacitance.

7. A converting circuit according to claim 6, wherein said third isolating circuit means comprises:
   a series-circuit of a first capacitance and a second capacitance; and
   a compensating circuit bridging the first capacitor for matching a direct-voltage component at the input and output connections of the first capacitance to the voltage at an interconnection point between said first and second capacitances.

8. A converting circuit according to claim 3, wherein the balancing circuit comprises an integrator which suppresses a range of frequencies above the lower cut-off frequency.

9. A converting circuit for converting an input voltage having a predetermined range of working frequencies, which predetermined range is exclusive of a range of control frequencies, into a proportional output voltage, comprising:
   an amplifier;
   a first variable branch impedance and a second branch impedance which are connected in parallel in relation to said range of working frequencies between said input voltage and said amplifier, said first and second branch impedance being approximately equal in value;
   first isolation circuit means which passes current in the range of working frequencies and blocks currents in the range of control frequencies connected in series circuit between said first branch impedance and said amplifier such that said first and second branch impedances are connected in series in relation to said range of control frequencies and in parallel in relation to said range of working frequencies, the series circuit of said first branch impedance and said first isolation circuit means connected in parallel with said second branch impedance between a junction between said first and second branch impedances and said amplifier; and
   a control circuit in which said first and second branch impedances are connected in series in relation to said range of control frequencies, said control circuit comprising,
   a balancing impedance connected in series with said first and second branch impedances in relation to said range of control frequencies, and
   a control voltage source for supplying a D.C. control voltage across the series combination of said balancing impedance and said first and second branch impedances, said D.C. control voltage and said balancing impedance connected in series across the junction between the second branch impedance and said amplifier and the junction between said first branch impedance and said first isolating circuit means, and
   a balancing circuit having an input derived from an output of said amplifier for generating a balancing signal applied to the control input of said variable impedance first branch impedance,
   wherein said balancing signal adjusts the impedance of said first branch impedance such that if the impedances of said first and second branch impedances change in relation to a component of the input voltage lying in the range of control frequencies, a predetermined proportionality between the input signal and the output signal is maintained in the range of said working frequencies.

10. A converting circuit according to claim 9, comprising:
    second isolating circuit means connected in series between said input voltage and the junction between said first and second branch impedances for passing currents in the range of working frequencies and blocking currents in the range of control frequencies.

11. A converting circuit according to claim 10, wherein the range of working frequencies is above a predetermined positive lower cut-off frequency, comprising:
    the first and second branch impedance respectively comprising a first variable branch resistance and a second branch resistance; and
    the balancing impedance comprising a balancing resistance.

12. A converting circuit according to claim 11, wherein said first isolating circuit means comprises an isolating capacitor.

13. A converting circuit according to claim 12, wherein the balancing circuit comprises an integrator which suppresses a range of frequencies above the lower cut-off frequency.

* * * * *